(12) United States Patent
Bao et al.

(10) Patent No.: US 6,429,040 B1
(45) Date of Patent: Aug. 6, 2002

(54) DEVICE COMPRISING A BIPOLAR SEMI-CONDUCTING FILM

(75) Inventors: Zhenan Bao, North Plainfield; Xiaochen Linda Chen, Parsippany, both of NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/543,808

(22) Filed: Apr. 6, 2000

(51) Int. Cl.$^7$ .............................................. H01L 51/40
(52) U.S. Cl. .................. 438/99; 438/478; 438/769; 438/770; 257/40; 257/295; 257/306; 257/310
(58) Field of Search .......................... 438/99, 770, 769, 438/478; 257/40, 310, 295, 306

(56) References Cited

U.S. PATENT DOCUMENTS

| | | | | |
|---|---|---|---|---|
| 5,912,473 A | * | 6/1999 | Wakita et al. | 257/40 |
| 5,981,970 A | * | 11/1999 | Dimitrakopoulos et al. | 257/40 |
| 6,133,410 A | * | 10/2000 | Geprags et al. | 528/392 |
| 6,252,245 B1 | * | 6/2001 | Katz et al. | 257/40 |
| 6,284,562 B1 | * | 9/2001 | Batlogg et al. | 438/99 |

OTHER PUBLICATIONS

Granier et al.; "All–Polymer Field–Effect Transistor Realized by Printing Techniques"; *Science*, vol. 265; dated: Sep. 16, 1994; pp. 1684–1686.

Roberts, et al.; "Lewis Acid Coordination Complexes of Polymers: 3. Poly (benzobisimidazobenzophenanthroline) ladder and semiladder polymers"; *Polymer*, vol. 35 No. 20; dated: 1994; pp. 4313–4325.

Arnold et al.; "Preparation Properties of High Molecular Weight Soluble Oxobenz[de]imidazobenzimidazoisoquinoline Ladder Polymer"; *Macromolecules*; vol. 2, No. 5; dated: Sep.–Oct. 1969; pp. 497–502.

Brown, et al.; "A Universal Relation Between Conductivity and Field–Effect Mobility In Doped Amorphous Organic Semiconductors"; *Synthetic Metals*; vol. 68; dated 1994; pp. 65–70.

Jarrett et al; "Field Effect Measurements In Doped Conjugated Polymer Films: Assessment of Charge Carrier Mobilities"; *American Institute of Physics*; J. Appl.Phys 77 (12); dated: Jun. 15, 1995; pp. 6289–6294.

Jenekhe et al; "Complexation–Mediated Solubilization and Processing of Rigid–Chain and Ladder Polymers in Aprotic Organic Solvents" *Macromolecules*; vol. 23; dated: 1990; pp. 4419–4429.

Bao, et al; "Soluble and Processable Regioregular Poly (3–hexylthiophene) For Thin Film Field–Effect Transistor Applications With High Mobility"; *American Institute of Physics*, Appl.Phys. Lett, 69(26); dated: Dec. 23, 1996; pp.4108–4110.

Thackeeray et al; "Poly (3 methylthiophene)—Coated Electrodes: Optical and Electrical Properties as a Function of Redox Potential and Amplification of Electrical and Chemical Signals Using Poly (3–methylthiophene)—Based Microelectrochemical Transistors".

* cited by examiner

*Primary Examiner*—Richard Elms
*Assistant Examiner*—Pho M. Luu
(74) *Attorney, Agent, or Firm*—Lowenstein Sandler PC

(57) ABSTRACT

An organic semiconducting material having bi-polar charge transport characteristics is described which may comprise the active layer of a field-effect transistor. The semiconducting material comprises a bi-polar polymeric film effective for hole or electron transport comprising a polymer having a conjugated framework with functional moieties capable of solvating ions or promoting ionic charge transport. The conjugated framework is selected from at least one of thiophene, pyrrole, benzene, naphthalene, antrhacene, and antrhacene-dione, and the functional moieties are selected from (i) functional side groups comprising salts of carboxylic acid and sulfonic acid and (ii) functional sites selected from heteroatoms having electron lone pairs comprising sulfur, nitrogen, and oxygen. The field-effect mobility of the bi-polar polymeric film is at least $10^{-3}$ cm$^2$/Vs when operating as an n-type or p-type device.

19 Claims, 6 Drawing Sheets

DEVICE COMPRISING A BIPOLAR SEMI-CONDUCTING FILM

FIELD OF THE INVENTION

The present invention relates to a semiconductor device fabricated with an organic material having bi-polar charge-transport characteristics.

BACKGROUND OF THE INVENTION

The metal-oxide semiconductor field-effect transistor (MOSFET or MOS device) is a dominant and important device in fabricating memory devices and integrated circuits, and various types of MOSFETS are known. MOSFET technology includes NMOS, PMOS, and CMOS technology. NMOS and PMOS devices are n-channel and p-channel devices, respectively, and CMOS devices comprise n-channel and p-channel devices integrated on the same chip. Other acronyms used to identify MOSFETs include DMOS (wherein "D" stands for "diffusion" or "double diffusion"), IGBT (Insulated Gate Bipolar Transistor), BCMOS (CMOS having bipolar devices), and DGDMOS (Dual Gate DMOS).

Demands for low-cost consumer electronics (e.g. large emissive displays, electronic paper, smart cards, and so forth) have precipitated the development of organic materials suitable for use in field-effect transistors (FETs) and other devices as conducting, semiconducting, and light-emitting materials. Organic materials are attractive for use in electronic devices as they are compatible with plastics and can be easily fabricated to provide low-cost, lightweight, and flexible devices with plastic substrates. Organic materials having a conductivity and carrier mobility permitting their use as the active layer in thin-film semiconductor devices are described in U.S. patent application Ser. No. 08/770,535, filed Dec. 20, 1996, "Method of Making An Organic Thin Film Transistor," by Zhenan Bao et al. (an inventor herein) (hereinafter the "Bao '535 application"), assigned to the present assignee and incorporated herein by reference. An organic device is further described in U.S. patent application Ser. No. 09/087,201, filed May 29, 1998, "Thin-Film Transistor Monolithocally Integrated With an Organic Light-Emitting Diode," by Zhenan Bao et al. (an inventor herein), which also is assigned to the present assignee and incorporated herein by reference.

Nearly all currently known organic materials useful as semiconductors in field-effect transistors are uni-polar, meaning that they are either p-type (positive charge transporting) or n-type (negative charge transporting). The uni-polar characteristics of these materials complicates the fabrication process and affects the cost of the FETs, because uni-polar materials must be patterned to form the desired regions of the FET device. For example, a CMOS device includes both p-type and n-type channel regions, and when uni-polar materials are used, these regions must be separately patterned and deposited. A significant cost reduction would ensue if bi-polar materials could be used, particularly with CMOS devices. Bi-polar semiconducting materials would not require patterning or at least require less patterning than uni-polar materials. A CMOS device is an advantageous circuit configuration for organic semiconductors, because it has a low static power dissipation and the transistors are "on" only during switching.

Additionally, there has been great interest recently in developing electronic circuits using fabrication methods that rely upon high-performance solution-processable materials, such as screen printing and ink-jet printing. Presently, of the uni-polar organic semiconductors, only a limited number are capable of operating in air, and the availability of soluble, semiconducting polymers remains limited. See, e.g., Bao, Z. et al., "Soluble and Processable Regioregular Poly(3-Hexylthiophene) for Thin Film Field-Effect Transistor Applications with High Mobility", APPL. PHYS. LETT., Vol 69, No. 26, at pp. 4108–4110 (1996), which is incorporated herein by reference. It would be advantageous to provide a device with an active semiconducting layer comprising a solution processable thin film.

As may be appreciated, those in the field of semiconducting devices continue to search for new materials and components to reduce the size, increase the efficiency, simplify the fabrication, and reduce the cost of fabricating the devices. In particular, it would be advantageous to provide a semiconducting device including use of a bi-polar organic material that is solution processable. These and further advantages may appear more fully upon considering the description given below.

SUMMARY OF THE INVENTION

Summarily described, the invention embraces a field-effect transistor comprising an organic semiconducting layer having bi-polar charge transport characteristics. The semiconducting layer comprises a bi-polar polymeric film effective for hole and electron transport comprising a polymer having a conjugated framework with functional moieties capable of solvating ions or promoting ionic charge transport. The conjugated framework is selected from at least one of thiophene, pyrrole, benzene, naphthalene, antrhacene, and antrhacene-dione, and the functional moieties are selected from (i) functional side groups comprising salts of carboxylic acid and sulfonic acid and (ii) functional sites selected from heteroatoms having electron lone pairs comprising sulfur, nitrogen, and oxygen. The field-effect mobility of the bi-polar polymeric film is at least $10^{-3}$ cm$^2$/Vs when operating as an n-type or p-type device.

BRIEF DESCRIPTION OF THE DRAWINGS

For better understanding of the invention, an exemplary embodiment is described below, considered together with the accompanying drawings, in which;

FIG. 2A shows values for n-type charge-transport characteristics and FIG. 2B shows values for p-type charge-transport characteristics;

FIG. 3A shows values for n-type charge-transport characteristics and FIG. 3B shows values for p-type charge-transport characteristics;

Figure 1:
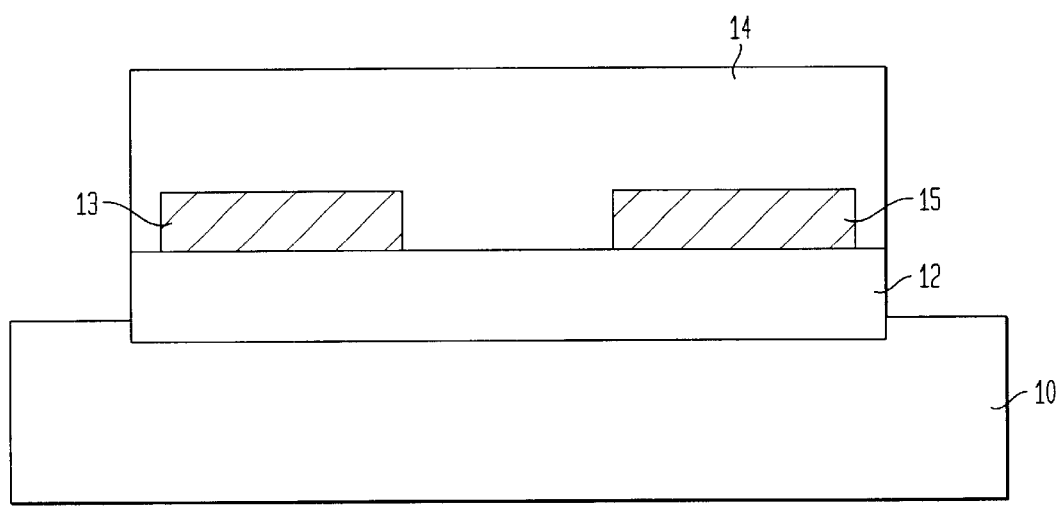
FIG. 1 is a schematic illustration of a field-effect-transistor (FET) including use of a bi-polar semiconducting material.

It is to be understood that these drawings are for the purposes of illustrating the concepts of the invention and are not limiting in nature.

DETAILED DESCRIPTION OF THE INVENTION

With this invention, a semiconductor device is provided that is fabricated with an organic material having bi-polar charge-transport characteristics.

Applicants have discovered a configuration for a field-effect transistor using certain polymeric materials that exhibit such effective bi-polar characteristics and may comprise solution processable films. By "effective bi-polar characteristics" or "effective n-type and p-type charge transport characteristics" it is meant that the material will be effective for hole or electron transport at mobilities that are sufficient for use in field-effect transistors and other electronic or opto-electronic devices, which typically means having field effect mobilities on the order of at least $10^{-3}$ cm$^2$/Vs for n-type and p-type charge transport.

The inventive polymers comprise a conjugated framework with functional side groups and functional sites capable of solvating ions or promoting ionic charge transport. The conjugated framework may include at least one of thiophene, pyrrole, benzene, naphthalene, antrhacene, or antrhacene-dione groups. Exemplary functional side groups comprise salts of carboxylic acid and sulfonic acid. Functional sites capable of solvating ions or promoting ionic charge transport include heteroatoms with electron lone pairs such as sulfur, nitrogen, and oxygen. The term "functional moieties" will be used herein to refer generally to both the functional side groups and the functional sites.

One embodiment of the inventive polymers comprise ammonium salts of a carboxylic acid of polythiophene. These polymers may include polymers and co-polymers having repeating units "A"; repeating units "B"; or a combination of repeating units "A" and "B", wherein these repeating units can be represented by the formulae:

(A)

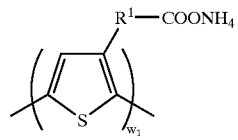

(B)

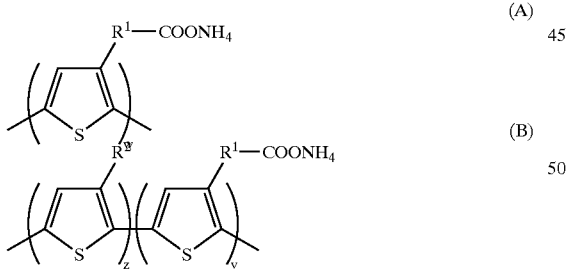

wherein $R^1$ and $R^2$, taken independently of each other, comprise an alkyl, ether, or aromatic group, more typically are linear or branched alkyl or ether groups having from 1 to 30 carbon atoms, more typically having from 1 to 20 carbon atoms, and even more typically having from 1 to 12 carbon atoms. The groups $R^1$ and $R^2$, taken independently of each other, may comprise the linear or branched alkyl or ether group represented as: $(-CH_2-)_n$, $[-O(-CH_2-)_m]_l$ and/or $(-CH_2-)_n[O-(-CH_2-)_m]_l$ where the values for each of l, m, and n may be from 0 to 30, and when taken together, the value for all of l, m, and n is greater than one, and typically is from 1 to 30, and more typically is from 1 to 20. The value for w and for y+z is from 4 to 1000. The value for z may be zero, and the value for y is at least one. Advantageously, y≧Z, although polymers having the formula where y <z are contemplated as falling within the scope of the invention.

In one embodiment, the polymer comprises an ammonium salt of poly(thiophene-3-propionic acid) (PT—COONH$_4$) having the formula (1), (I)

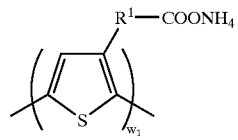

where $R^1$ is an ethyl group and $w_1$ has a value of from 4 to 1000.

In another embodiment of the invention the conjugated polymers comprise derivatives of napthalene tetra-anhydrides or poly(benzophenanthroline). These polymers may comprise repeating units "C" represented by the formula:

(C)

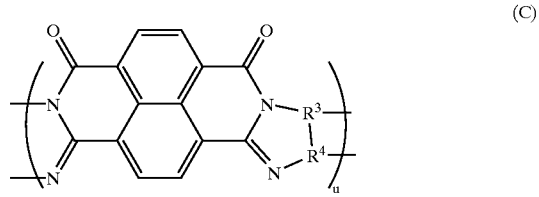

wherein $R^3$ and $R^4$, taken together, may comprise benzene, phenylbenzene, naphthalene, anthracene, or anthracene-dione; and u is an integer of from 1 to 1,000. Accordingly, in one embodiment, $R^3$ and $R^4$ taken together are benzene such that the invention comprises a poly(benzimidazole-benzophenanthroline) (BBL), represented by the formula (II):

(II)

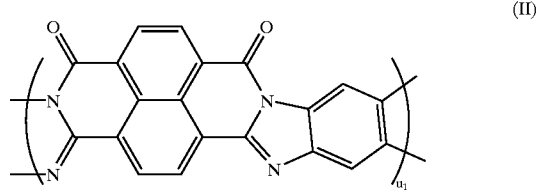

wherein $u_1$ has a value of from 1 to 1000.

Additional specific embodiments can be depicted depending on the values for $R^3$ and $R^4$. To illustrate, where $R^3$ and $R^4$ taken together are a 4-phenylbenzene group, the polymer can be represented by the formula (III):

(III)

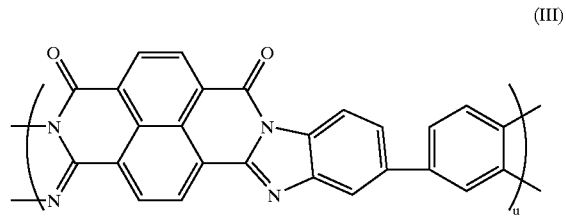

Where R³ and R⁴ taken together are a napthalene group, the polymer can be represented by the formula (IV):

(IV)

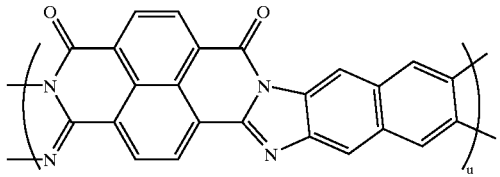

Where R³ and R⁴ taken together are an anthracene group, the polymer can be represented by the formula (V):

(V)

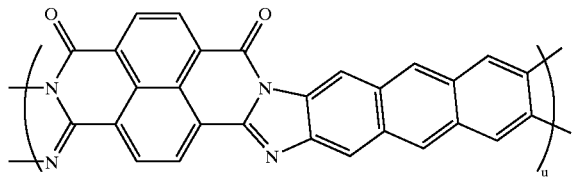

Where R³ and R⁴ taken together are an anthracene-dione group, the polymer can be represented by the formula (VI):

(VI)

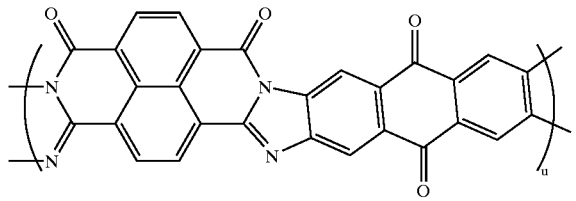

Each of these polymers has conjugated frameworks, with functional groups or functional sites capable of solvating ions and promoting ion transport, and mobile ionic species. The polymers comprising derivatives of napthalene tetraanhydrides may include trace amounts of impurities such as $AlCl_3$ or $GaCl_3$.

The conjugated polymers according to the invention, particularly the PT—$COONH_4$ and BBL polymers (e.g., represented by formulae I and II, above), may be fabricated according to processes known in the field. Suitable processing methods are described, for example, in F. E. Arnold et al., "*Preparation and Properties of High Molecular Weight, Soluble Oxobenz[de]imidazo-benzimidasoiso-quinoline Ladder Polymer,*" MACRO-MOLECULES Vol. 2, No. 5 at pp. 497–502 (1969); and S. A. Jenekhe, "*Complexation-Mediated Solubilization and Processing of Rigid-Chain and Ladder Polymers in Aprotic Organic Solvents,*" MACROMOLECULES Vol. 23, at pp. 4419–4429 (1990), both of which are incorporated herein by reference. Synthetic schemes for preparation of polythiophene derivatives are set forth in Bao Z. et al., "*Soluble Regioregular Polythiophene Derivatives as Semiconducting Materials for Field-Effect Transistors,*" CHEM. MATER. Vol. 11 at pp. 2607–12 (1999), incorporated herein by reference. Methods of synthesizing BBL and solution complexes thereof are described in M. F. Roberts et al., "*Lewis Acid Coordination Complexes of Polymers,*" POLYMER Vol. 35, No. 20 (1994), incorporated herein by reference.

The conjugated bi-polar polymers as described herein provide advantages over previous organic semiconducting materials, as the present polymers comprise solution-processable, amorphous materials. They are easy to fabricate directly from solution by spin-coating or casting. In comparison, one example of an organic compound exhibiting bi-polar behavior in an FET configuration comprises pentacene single crystals. At room temperature, field-effect mobilities for pentacene single crystals of 2.7 $cm^2/Vs$ for p-type and 1.7 $cm^2/Vs$ for n-type charge transport were observed. However, as discussed above, solution processable materials are preferred over the vacuum-evaporated crystalline materials. In addition, the operation mechanism for the inventive bipolar materials differs from that of single crystals, which is discussed further below.

Referring to FIG. 1, there is shown an exemplary inventive transistor device fabricated with use of the bi-polar organic semiconducting materials. A layer of n-doped silicon comprises the substrate and gate 10, over which is disposed a dielectric layer 12 of thermally-grown silicon dioxide. In this example, the dielectric layer was fabricated with a thickness of about 3000 Å and a capacitance of about 11 $nF/cm^2$. A typical bottom contact geometry was used, e.g., photolithographically-defined electrodes comprising a source 13 and drain 15 were fabricated to form channels about 250 µm in width and 1.5, 4, 12, and 25 µm in length. A top contact geometry also may be used but is less preferred due to difficulties associated with forming small channel lengths (e.g., of <25 µm) with the top contact geometry. When a top contact geometry is used, photolithography needs to be carried out on the active materials which may cause degradation of such materials. Processes for forming the semiconductor and insulating layers are known in the field and described in the literature. See, e.g., U.S. Pat. No. 5,670,396, "Method of Forming a DMOS-Controlled Lateral Bipolar Transistor," issued Sep. 23, 1997; U.S. Pat. No. 5,395,776, "Method of Making a Rugged DMOS Device," issued Mar. 7, 1995; U.S. Pat. No. 5,381,031, "Semiconductor Device With Reduced High Voltage Termination Area and High Breakdown Voltage," issued Jan. 10, 1995, all of which were assigned to Lucent Technologies, Inc., the assignee herein, and are incorporated herein by reference.

To achieve the structure of FIG. 1, polymer films comprising the conjugated polymers may be solution cast over the surfaces of the electrode 13, and dielectric layer 12 to form semiconductor layer 14. In demonstrating the concepts of the invention, FET devices were prepared as illustrated in FIG. 1 using the polymers comprising PT—$COONH_4$ and BBL. The polymer films may be fabricated on the transistor device utilizing a reversible Lewis acid coordination complexation method as described in M. F. Roberts et al., "*Lewis Acid Coordination Complexes of Polymers,*" referenced above and incorporated herein. For example, a semiconductor thin film of BBL may be prepared with a dilute solution of BBL and either aluminum chloride ($AlCl_3$) or gallium chloride ($GaCl_3$) in nitromethane (about 0.3 wt % BBL in nitromethane). About four moles of aluminum chloride ($AlCl_3$) or gallium chloride ($GaCl_3$) may be used for each mole of repeat unit of BBL (e.g., a solution having a stoichiometry of about 4:1 $AlCl_3$:BBL in nitromethane may be used). The solutions may be spin-cast onto the electrode and dielectric surfaces, regenerated in deionized water, and dried under vacuum. Applying this method, films may be formed with resultant thicknesses in the range of about 10 to 500 nm, and preferably with thicknesses of less than 50 nm.

According to one aspect of the invention, a semiconductor thin film of PT—$COONH_4$ may be prepared with a dilute solution of PT—$COONH_4$ in ammonium hydroxide (e.g., about 0.1–0.3 wt % PT—COONH$_4$). This solution may be drop-cast onto the electrode and dielectric surfaces and dried under vacuum at a temperature and for a period sufficient to dry the solution to a solid thin film. A suitable temperature and processing time for vacuum drying is about 60 to 150 degrees C for about 24 hours. Applying this method, a semiconductor film having a thickness in the range of about 10 to 500 nm may be formed.

Figure 2A:
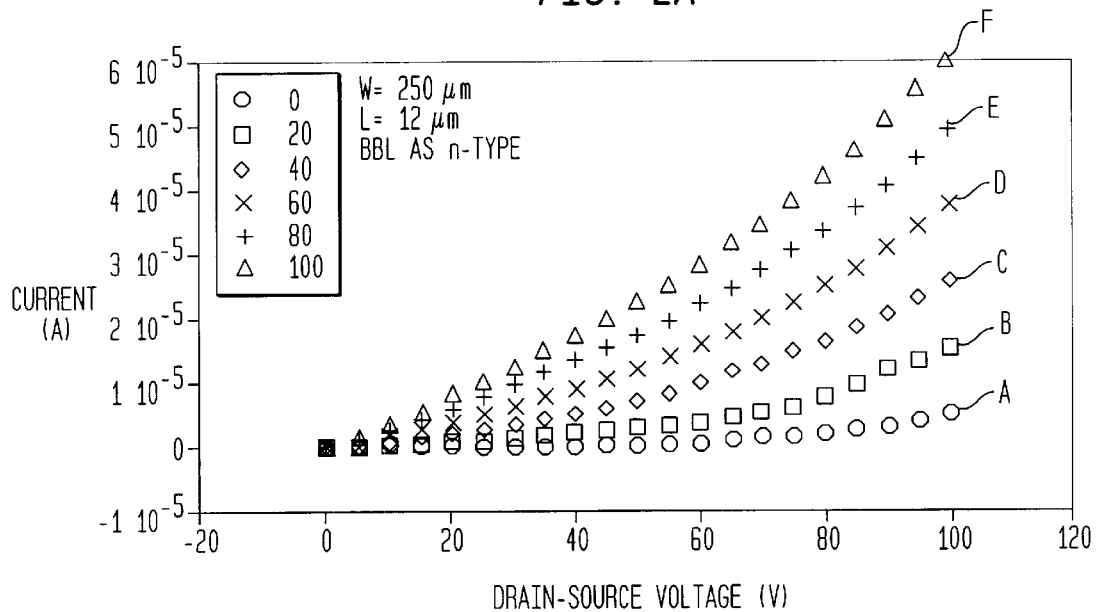
FIGS. 2A and 2B are graphs plotting current-voltage (I-V) values for an inventive FET device using BBL as the bi-polar semiconducting material, where
Figure 2B:
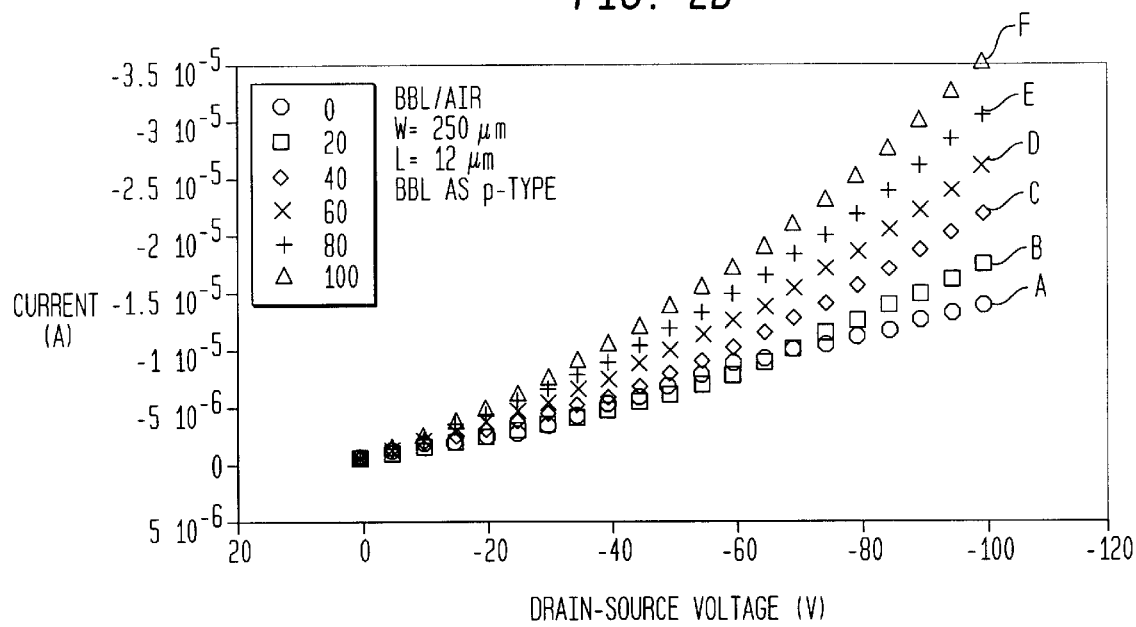

Illustrating one aspect of the invention, an FET device having the structure schematically shown in FIG. 1, using a thin-film of BBL prepared as described above, was fabricated and its current-voltage characteristics measured. FIGS. 2A and 2B are graphs plotting the results of these measurements. In FIG. 2A, the BBL film operated as an n-type charge transport material, and in FIG. 2B, the BBL film operated as a p-type charge transport material. Current-voltage measurements were made for different gate voltages at room temperature, i.e., gate voltages of 0, ±20, ±40, ±60, ±80 and ±100V were used and are reflected by lines A, B, C, D, E and F, respectively, on FIGS. 2A and 2B. These measurements were obtained with a Hewlett-Pachard (HP) 4155A Semiconductor Parameter Analyzer.

From FIGS. 2A and 2B, it can be seen that the BBL polymer (prepared from AlCl$_3$) exhibited both n-type and p-type field effects under ambient conditions. In a number of ways, the inventive devices exhibited behavior similar to typical n-type and p-type FET devices operating in the accumulation mode. In particular, at a fixed gate voltage ($V_G$), the drain-source current ($I_{DS}$) increased with drain-source voltage ($V_{DS}$). Also, the on-off ratio reflected the ratio between the current at a given gate voltage and zero gate voltage. For semiconductor thin films of either PT—COONH$_4$ or BBL, the on-off ratios were in the range of about 2 to 50. Another typical characteristic observed was that when a negative gate bias was applied, the negative drain-source current scaled with the gate voltage, and when a positive gate bias was applied, the positive drain-source current scaled with the gate voltage. This scaling of the drain-source current with gate voltage reflects typical gate-modulated transistor behavior.

However, the inventive devices using the bi-polar organic films exhibited various differences from typical n-type and p-type FET devices. For example, as can be seen in FIGS. 2A and 2B, it was found that the drain current ($I_{DS}$) increased nonlinearly with increasing drain voltage ($V_{DS}$) at a given gate bias. In contrast, with typical FET devices the drain current will ordinarily increase linearly with increasing $V_{DS}$ to a saturation region. The unusual current-voltage (I-V) characteristics of the inventive devices probably are not due to high off-currents resulting from high dopant concentrations, because the atypical I-V characteristics were manifested even when the off-current was subtracted from the drain current. The drain current versus drain voltage ($V_{DS}$) characteristics of the inventive devices suggests the presence of an electric-field dependent charge density or mobility. Another atypical characteristic is that the drain current scaled with the gate voltage ($V_G$) nonlinearly at drain voltages greater than the gate voltage, i.e., where $V_{DS}>V_G$. In typical FET devices, the drain current will scale with $V_G^2$.

A further atypical characteristic observed with the inventive devices was that the current-voltage values shifted with repeated scans. As the number of scans was increased, the values for the off-current increased and the on/off ratio decreased. When the gate bias was reversed and then switched back to the original polarity, the current-voltage values and the on/off ratios would return to values close to their initial values, e.g., to values within about ±20% of the initial values.

The field-effect mobilities of the inventive devices were estimated using Equation (1), at fixed drain voltage:

$$I_{DS}=(W/2L)\mu C_i(V_G-V_o)^2+I_{106} \quad (1),$$

where $I_{DS}$ is the drain-source current, W and L are the channel width and length, respectively, $\mu$ is the field-effect mobility, $C_i$ is the capacitance per unit area of the insulating layer, $V_G$ and $V_o$ are the gate and threshold voltage, respectively, and $I_\Omega$ is the ohmic current that flows through the semiconductor film. In making these calculations, it was assumed that $I_\Omega$ is independent of gate bias. The inventive devices were found to exhibit high field-effect mobilities (e.g., >0.001 cm$^2$/Vs) when operating as either n-type or p-type devices. The field-effect mobility of BBL devices (fabricated with AlCl$_3$) was as high as 0.06 cm$^2$/Vs for n-type field effects and 0.03 cm$^2$/Vs for p-type field effects. The mobility of BBL devices fabricated with CaCl$_3$ tends to be four or five times lower, e.g., 0.01 cm$^2$/Vs for n-type and 0.005 cm$^2$ Ns for p-type field effects. Notably, Equation (1) provides a rough estimation of the field-effect mobility, as it generally describes the current-voltage relationship for a MOSFET at the saturation region. In the inventive devices using the bi-polar polymeric thin films, the current-voltage curves do not saturate, even when $V_{DS}>V_G$.

Figure 3A:
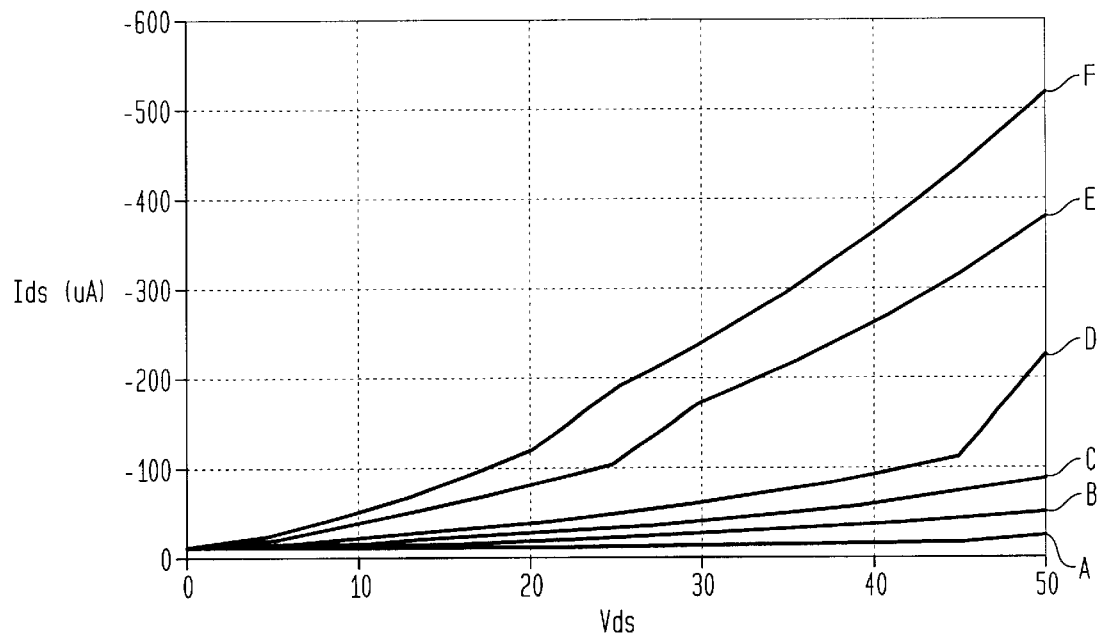
FIGS. 3A and 3B are graphs plotting current-voltage (I-V) values for an inventive FET device using PT—COONH$_4$ as the bi-polar semiconducting material, where
Figure 3B:
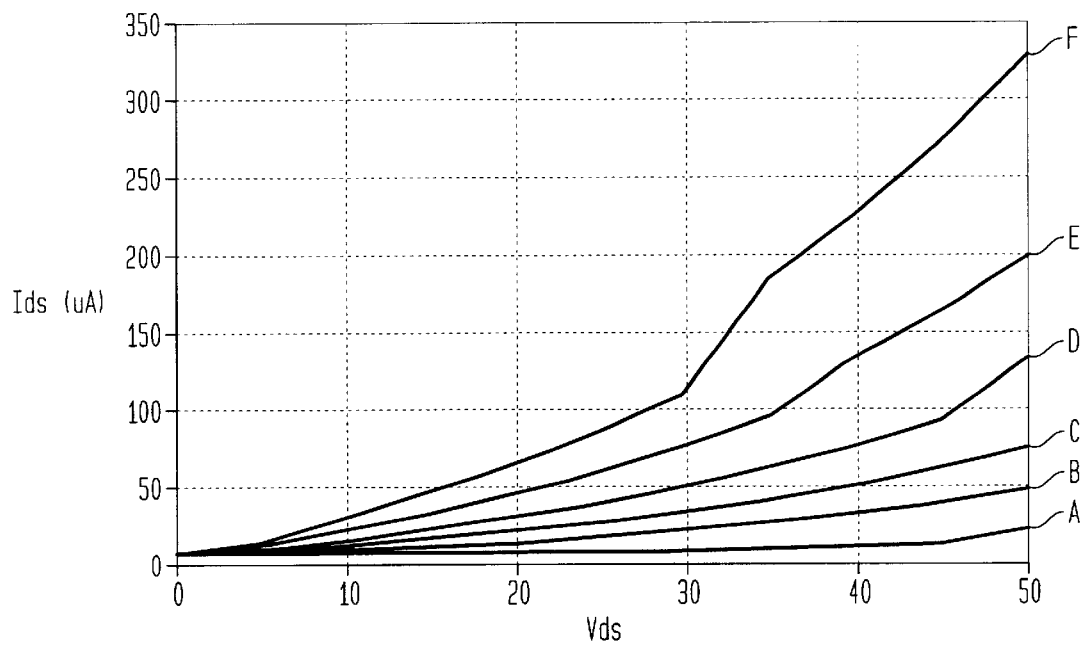

FIGS. 3A and 3B are graphs plotting the current-voltage characteristics of an inventive FET device, as in FIG. 1, but with a thin-film of PT—COONH$_4$ prepared as previously described. As with the BBL devices, current-voltage measurements were made at room temperature for gate voltages of 0, ±10, ±20, ±30, ±40 and ±50V, plotted on FIGS. 3A and 3B as lines A, B, C, D, E and F, respectively. As can be seen, the devices having the PT—COONH$_4$ films exhibited behavior analogous to those having the BBL films, e.g., at a fixed gate voltage ($V_G$), the drain-source current ($I_{DS}$) increased with drain-source voltage ($V_{DS}$); the on-off ratio reflected the ratio between the current at a given gate voltage and zero gate voltage and was in the range of about 2 to 50; the drain-source current scaled with gate voltage; the drain current ($I_{DS}$) increased nonlinearly with increasing drain voltage ($V_{DS}$) at a given gate bias; the drain current scaled with the gate voltage ($V_G$) nonlinearly at drain voltages greater than the gate voltage, i.e., where $V_{DS}>V_G$; and the current-voltage values shifted with repeated scans.

The field-effect mobilities of the PT—COONH$_4$ devices vary and in some instances may be higher than with the BBL devices. The field-effect mobility of PT—COONH$_4$ devices can be as high as 0.72 cm$^2$/Vs for n-type field effects and 1.73 cm$^2$/Vs for p-type field effects. In contrast, devices having thin films prepared from mixtures of poly(ethylene oxide) (PEO) and lithium chloride (LiCl) or lithium trifluoromethane sulfonate (LiCF$_3$SO$_3$) (5 molar % vs. PEO) showed low conductivity and no field-effects. The molar ratio of LiCl or LiCF$_3$SO$_3$ to the CH$_2$CH$_2$O moieties in PEO was about 1:20.

Applicants have further discovered that the bi-polar behavior of the polymeric films may be related to dopant concentration, moisture, temperature, and ionic species. With regard to the dopant concentration, it was found that the bi-polar characteristics would change (e.g., the devices would begin to exhibit uni-polar characteristics) upon exposure to conditions potentially affecting the dopant concentrations. To illustrate, transistors fabricated with BBL as above would initially exhibit bi-polar behavior; however, after being pumped under vacuum for a period of time (e.g., at 10$^{-3}$ Torr for about 24 hours), only n-type behavior was observed. Also, after the vacuum pumping, the drain current ($I_{DS}$) increased linearly with increasing drain voltage and saturates when $V_{DS} > V_G$, as with typical FET devices.

Figure 4:
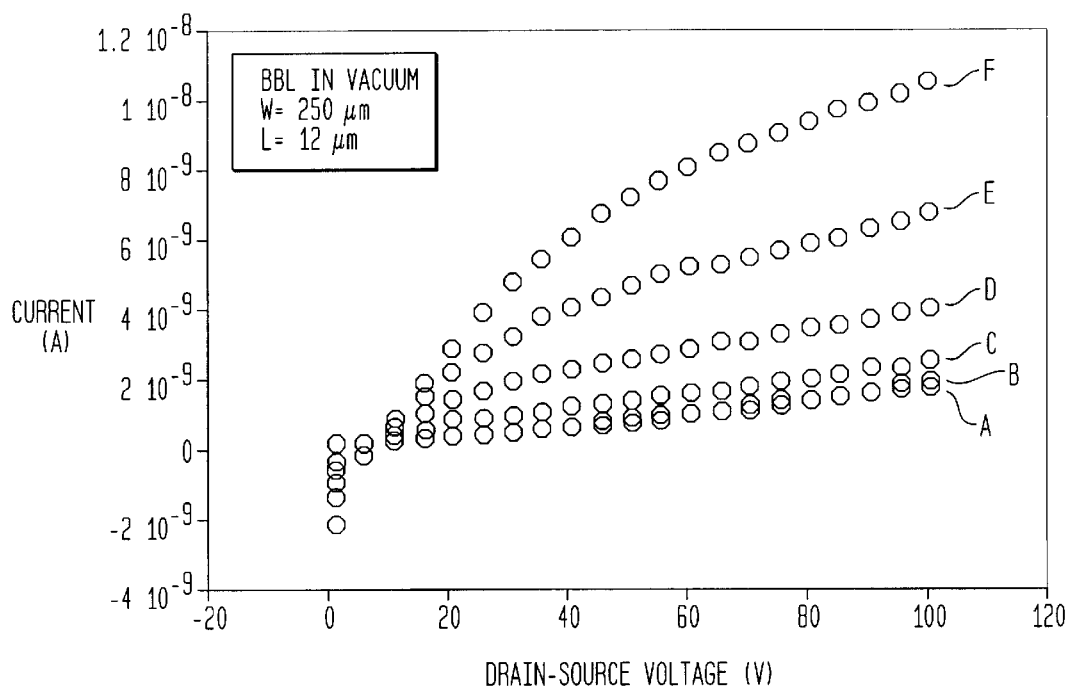
FIG. 4 is a graph plotting current-voltage (I-V) values for an inventive FET device using BBL as the bi-polar semiconducting material which has been vacuum-pumped.

For example, FIG. 4 shows the current-voltage characteristics of an FET device having a thin-film of BBL (prepared from $AlCl_3$) that has been vacuum-pumped at $10^{-3}$ Torr for 24 hours. Measurements were made as above for gate voltages of 0, 20, 40, 60, 80 and 100V, plotted on FIG. 4 as lines A, B, C, D, E and F, respectively. As can be seen, with these devices there was a linear relationship between current and voltage until reaching a saturation point. The field-effect mobility of these vacuum-pumped devices was calculated according to Equation (1), above, to be $4 \times 10^{-3}$ cm$^2$/Vs. After the samples were exposed to ambient atmosphere, the bi-polar activity returned. Consequently, the BBL may be intrinsically an n-type semiconductor, and the bi-polar activity may be the result of doping by oxygen and moisture in air. However, the BBL device can remain stable in air for many months without any noticeable change in performance characteristics.

The PT—COONH$_4$ is likely intrinsically a p-type material with dopants responsible for its bi-polar activity. The dopants responsible for the bi-polar behavior likely are incorporated into the fresh samples when prepared, and will slowly diffuse out of the samples or decompose with time. The devices fabricated with PT—COONH$_4$ lost their bi-polar (n-type) field effects (retaining their p-type effects) when stored in various conditions (e.g. under vacuum, in N$_2$, or in air) for several days after fabrication.

X-ray diffraction and electron diffraction shows that the inventive polymeric films, as illustrated by embodiments comprising PT—COONH$_4$ and BBL, are amorphous, which likely impact on the intrinsic mobilities of the films. High bi-polar mobilities can be partially attributed to higher dopant levels. By "high" bi-polar mobilities as used herein it is meant that the field-effect mobilities are greater than about 0.01 cm$^2$/Vs for both n-type and p-type behavior. The mobile ion concentrations were estimated to be about $2 \times 10^{18}$ and $8 \times 10^{17}$ cm$^{-3}$, for the negative and positive ions in BBL when it is prepared with aluminum chloride ($AlCl_3$), which is about ten times higher than the mobile ion concentrations when the BBL was prepared with gallium chloride ($GaCl_3$). Since the compound should be neutral, some immobile positive ions are expected. The activation energy of the ionic mobility in BBL for negative ions is approximately 250 meV for samples prepared using either $AlCl_3$ or $GaCl_3$ and for positive ions is about 350 meV for samples prepare using $AlCl_3$ and about 480 meV for samples prepare using $GaCl_3$. The mobile ion concentration for PT—COONH$_4$ was lower than for the BBL samples, e.g., on the order of about $10^{16}$ cm$^{-3}$, and the activation energy was about 350 meV for positive ions.

It has been taught that there is a relationship between doping concentration and field-effect mobility, and that in amorphous semiconducting materials, as the doping concentration increases, the field-effect mobility increases and the on/off ratio decreases. See, e.g., A. R. Brown et al., "*A Universal Relation Between Conductivity and Field-effect mobility in Doped Amorphous Organic Semiconductors,*" SYNTHETIC METALS Vol. 68 at pp. 65–70 (1994), and C. P. Jarrett et al., "*Field Effect Measurements in Doped Conjugated Polymer Films: Assessment of Charge Carrier Mobilities,*" J. APPL. PHYS. Vol. 77, No. 12 (Jun. 15, 1995), at pp. 6289–6294, both of which are incorporated herein. Thus, according to these teachings, one would expect that the on/off ratios for the PT—COONH$_4$ and BBL devices (having field effect mobilities as high as about 0.7 to 1.7 cm$^2$/Vs and 0.06 to 0.03 cm$^2$/Vs, respectively), would be below 1.5.

However, surprisingly the on/off ratios for the inventive devices are between about 2 to 50, suggesting different mechanisms than in previous devices. In typical operation of organic FETs based on undoped organic semiconductors, the material at the semiconductor/electrode interface is oxidized or reduced during charge injection, and the contact between the electrodes (typically fabricated with gold) and the organic semiconductor is nearly ohmic so that charges can be induced by field effect and accumulate at the interface between semiconductor and dielectric layer. As a result, the conjugated backbones are distorted by injected charges and form "extrinsic" polaron or bipolaron states. The charge transport is then realized by "hopping" from one molecule to another, and the polaron or bipolaron moves along in the channel leaving behind its pristine form. For doped materials, there are electron transfers between polymers and dopants, and the polymers are permanently chemically doped. This permanent chemical doping leads to "intrinsic" polaron or bipolaron states. Thus, both on and off current will be high, leading to low on-off ratios.

In the inventive polymers, ionic species can be weakly bounded to the functional moieties (e.g., nitrogen atoms in BBL and sulfur atoms in PT—COONH$_4$). When the polymers are incorporated In a FET configuration, electrons or holes are injected from the source electrode, leading to reduction or oxidation of the conjugated polymer near the electrodes and near dielectric interface. These reduced or oxidized polymers are then compensated (stabilized) by counter-ions from dissociated ionic species which essentially dope the polymer (the ionic species dope the reduced, oxidized polymers). As a result, there is a permanent lattice distortion, and "intrinsic" polaron or bipolaron states are generated. Due to this doping effect, low contact resistance and easy charge injection are contemplated. The polymer that is near the organic/dielectric interface only gets electrochemically doped during the on state. In the "off" state, small amounts of enhancement in "off" current is expected. In the "on" state, the amount of induced charges increases with the gate bias, leading to heavier doping and resulting in the field-dependence of the drain source current. Thus, the on-off ratio is much higher for the inventive polymers than with previous transistor materials.

Since both positive and negative mobile ions are present in the inventive polymers, both field induced n- and p-doping at the polymer/dielectric interface are possible, thus explaining the bipolar field-effect behavior observed in the inventive polymers. The existence of the conjugated polymer is advantageous for the field and ion-assisted doping, and this phenomena is not expected for non-conjugated ionic polymers, e.g., a polyethylene oxide and lithium chloride mixture.

Figure 5A:
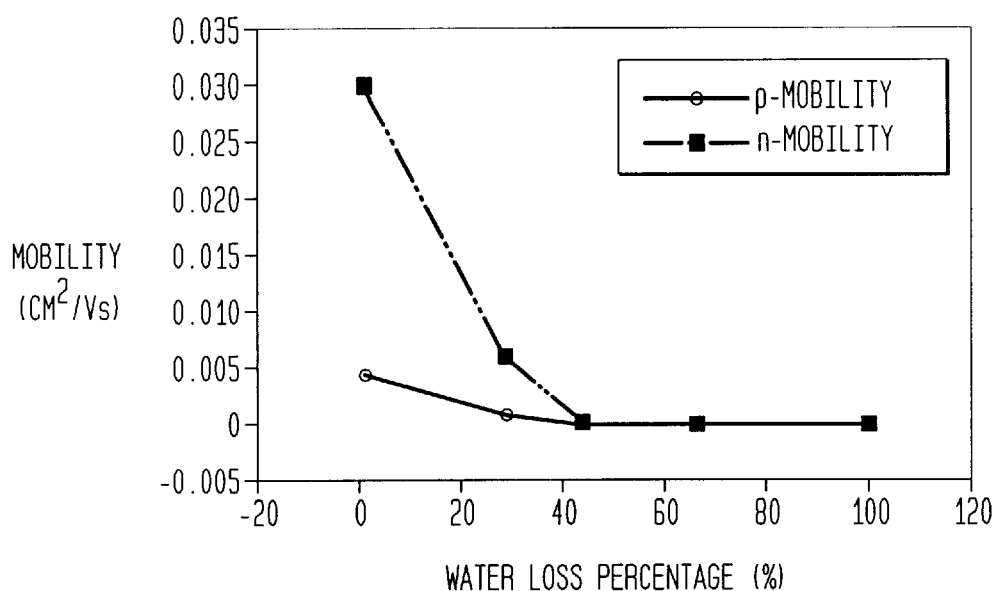
FIG. 5A is a graph plotting field-effect mobilities as a function of moisture content (water loss percentage) of an inventive FET device using BBL as the bi-polar semiconducting material.
Figure 5B:
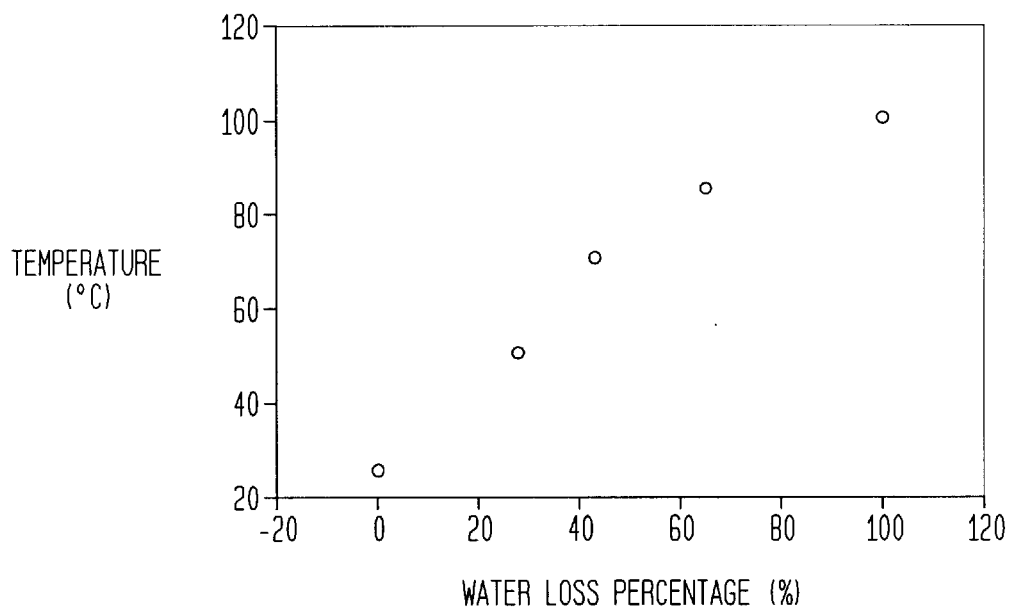
FIG. 5B is a graph plotting the water loss percentage as a function of temperature.

FIG. 5A is a graph plotting the mobility of an inventive BBL-FET device as a function of moisture (water loss percentage), where line "n" reflects a plot of the n-type mobility and line "p" plots the p-type mobility. Moisture concentration for the BBL device as initially prepared was about 5 wt % water, which corresponds to about one water molecule per polymer repeating unit. Upon heating, the moisture concentration decreased, as shown in FIG. 5B which plots the water loss percentage as a function of temperature. As can be seen in FIG. 5A, upon an increase in temperature and decrease in moisture, the field-effect mobility also decreased. Looking at both FIGS. 5A and 5B, at temperatures above 85° C., both n-type and p-type behavior disappeared. The bi-polar behavior and moisture concentration were recovered when the device was cooled to below 85° C. In contrast, the field-effect mobility of the PT—COONH$_4$-FET devices showed only slight temperature dependence.

Applicants have discovered that the bi-polar characteristics of the organic semiconducting materials also may be related to the presence of ionic species. The current at a given voltage for the FET devices was measured as a function of time and the results plotted in FIGS. 6 and 7, where FIG. 6 reflects values for a PT—COONH$_4$-FET device, and FIG. 7 for a BBL device. To measure ionic currents, a sample that has been applied for a sufficient period of time (typically 1500 sec) to accumulate mobile ions at the anode is subject to an electric field that has opposite polarity. The transient current was measured in the temperature range of from 290 to 350 K using a Keithley 6517 Electrometer and a slightly modified text fixture (Keithley 8002A). As can be seen, in both cases the current increased with time, saturated, and then dropped toward its initial value. This behavior can be ascribed to the movement of the mobile ions in the polymer film vis-a-vis the electrodes upon application of an electric field. The PT—COONH$_4$ polymer contains ionic sidechains, and the BBL thin films likely have ionic species present due to use of the Lewis acid in solubilizing the BBL during film preparation, as described above. The field-effect mobility of the BBL devices was affected, however, by the particular Lewis acid used (e.g., AlCl$_3$ or GaCl$_3$).

Figure 6:
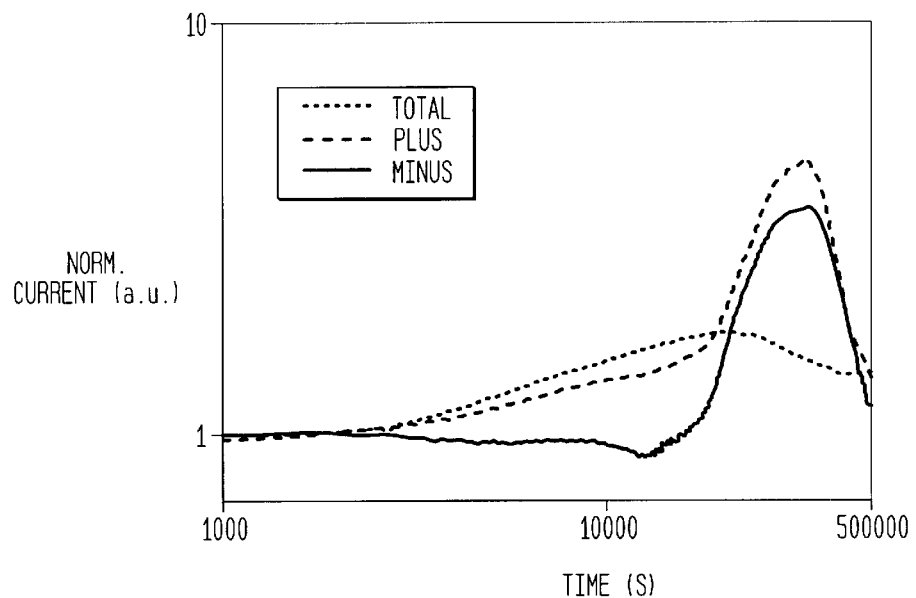
FIG. 6 is a graph plotting the current as a function of time during operation of an inventive FET device using PT—COONH$_4$ as the bi-polar semiconducting material.
Figure 7:
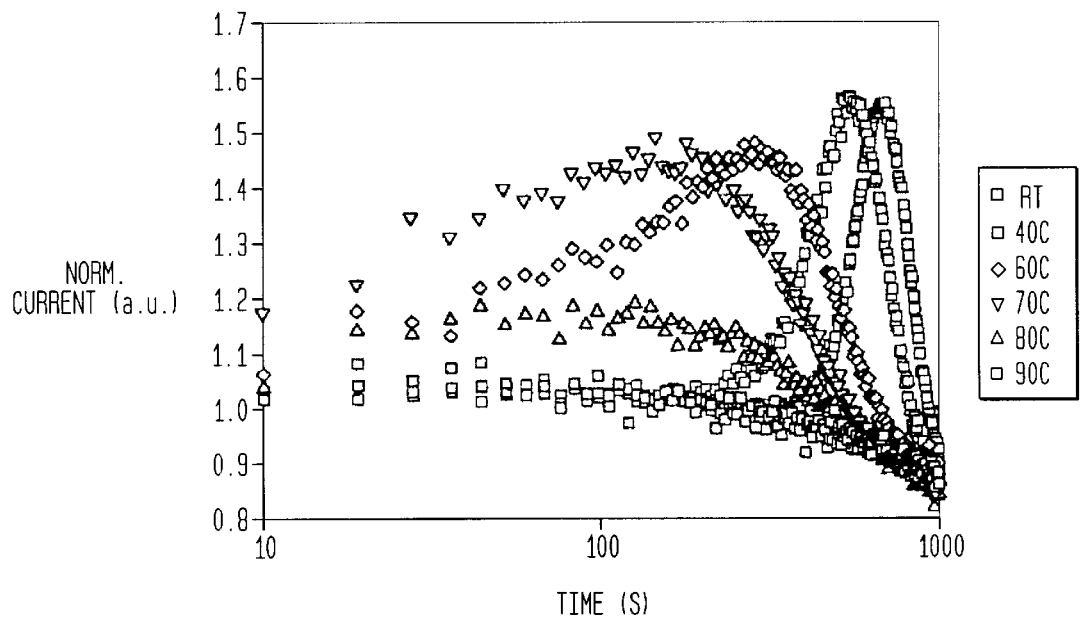
FIG. 7 is a graph plotting the current as a function of time during operation at different temperatures of an inventive FET device using BBL as the bi-polar semiconducting material.

As can be seen in FIGS. 6 and 7, initially upon application of an electric field, the ions would move to one electrode, where they accumulated, and then, upon changing the polarity of the field, the current versus time was recorded as the ions the ions drift toward the counter-electrode. A positive peak is generated as the mobile ions arrive at an electrode, and when all or substantially all the ions have accumulated at the electrode, the current would drop to its initial value. The size of the peaks differed for the positive and negative ions, i.e., for both the PT—COONH$_4$ and BBL devices, the positive current peak was smaller and broader than the negative current peak. To illustrate, in FIG. 6, the line designated "n" reflects the negative current peak, and the line designated "p" reflects the positive current peak. The line designated "T" reflects the total current.

In FIG. 7, various plots of the current as a function of time were made for different temperatures. For the BBL devices, the mobility of the negative ions increased with increasing temperature, as with a thermally-activated process generally observed for mobile ions. As noted, the mobility of the PT—COONH$_4$ was found not to be temperature dependent, and no significant drop in the signal was observed for temperatures of up to 120° C.

It is understood that the embodiments described herein are merely exemplary and that a person skilled in the art may make variations and modifications without departing from the spirit and scope of the invention. For example, although the invention is illustrated with reference to field-effect transistors, it may be applied to other devices in which organic semiconducting materials may be used, such as sensors, including moisture sensors. All such variations and modifications are intended to be included within the scope of the appended claims.

We claim:

1. A field-effect transistor comprising an organic semiconducting layer, wherein the semiconducting layer comprises a bi-polar polymeric film effective for hole and electron transport comprising a polymer having a conjugated framework with functional moieties capable of solvating ions or promoting ionic charge transport.

2. The field-effect transistor of claim 1 having at least two electrodes wherein the distance between the at least two electrodes defines a channel length, the channel length being about less than 25 μm.

3. The field-effect transistor of claim 1 in which the field-effect mobility of the bi-polar polymeric film is at least $10^{-3}$ cm$^2$/Vs when operating as an n-type or p-type device.

4. The field-effect transistor of claim 1 in which the conjugated framework is selected from at least one of thiophene, pyrrole, benzene, naphthalene, antrhacene, and antrhacene-dione.

5. The field-effect transistor of claim 1 in which the functional moieties are selected from (i) functional side groups comprising salts of carboxylic acid and sulfonic acid and (ii) functional sites selected from heteroatoms having electron lone pairs comprising sulfur, nitrogen, and oxygen.

6. The field-effect transistor of claim 1 in which the bi-polar polymeric film comprises a thiophene-based polymer having the formula:

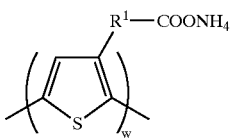

in which:

R$^1$ is a linear or branched alkyl or ether having from 1 to 30 carbon atoms; and w is an integer of from 4 to 1,000.

7. The field-effect transistor of claim 6, wherein R$^1$ is selected from (—CH$_2$—)$_n$; [—O(—CH$_2$—)$_m$]$_l$; and (—CH$_2$—)$_n$[O—(CH$_2$—)$_m$]$_l$; and the value for each of l, m, and n, taken independently of each other, is from 0 to 30, and the value for l+m+n is at least one.

8. The field-effect transistor of claim 6 in which the polymer comprises an ammonium salt of poly(thiophene-3-propionic acid).

9. The field-effect transistor of claim 1 in which the bi-polar polymeric film comprises a thiophene-based polymer having the formula:

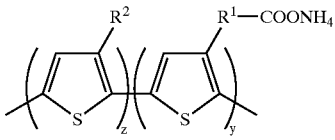

wherein R$^1$ and R$^2$, taken independently of each other, comprise linear or branched alkyl or ether groups having from 1 to 30 carbon atoms; and z may be 0, y is at least one, and the value for y+z is from 4 to 1000.

10. The field-effect transistor of claim 9, wherein R$^1$ and R$^2$ are selected from (—CH$_2$—)$_n$; [—O(—CH$_2$—)$_m$]$_l$; and (—CH$_2$—)$_n$[O—(CH$_2$—)$_m$]$_l$; and the value for each of l, m, and n, taken independently of each other, is from 0 to 30, and the value for l+m+n is at least one.

11. The field-effect transistor of claim 1 in which the polymer has the formula:

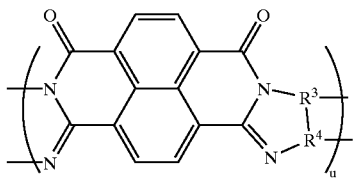

in which $R^3$ and $R^4$, taken together, are selected from benzene, phenyl benzene, naphthalene, anthracene, or anthracene-dione; and u is an integer of from 1 to 1,000.

12. The field-effect transistor of claim 11 in which the polymer comprises poly(benzimidazole-benzophenanthroline).

13. A sensor or integrated circuit device including the field-effect transistor of claim 1.

14. A thin film field-effect transistor comprising:
a gate electrode on a substrate;
a layer of insulating material over the substrate;
an active layer of a bi-polar polymeric film according to claim 1; and
a source electrode and a drain electrode in contact with the active layer.

15. A field-effect transistor having an active semiconducting layer comprising a bi-polar polymeric film effective for hole or electron transport comprising a polymer having a conjugated framework with functional moieties capable of solvating ions or promoting ionic charge transport, wherein the conjugated framework is selected from at least one of thiophene, pyrrole, benzene, naphthalene, antrhacene, and antrhacene-dione, and the functional moieties are selected from (i) functional side groups comprising salts of carboxylic acid and sulfonic acid and (ii) functional sites selected from heteroatoms having electron lone pairs comprising sulfur, nitrogen, and oxygen.

16. The field-effect transistor of claim 15 having an on/off ratio of about 2 to 50.

17. The field-effect transistor of claim 15 having a field-effect mobility of greater than 0.001 $cm^2$/Vs when operating as an n-type or p-type device.

18. The field-effect transistor of claim 15 in which the active layer comprises BBL having a field-effect mobility within the range of about 0 to 0.06 $cm^2$/Vs for n-type field effects and in the range of about 0 to 0.03 $cm^2$/Vs for p-type field effects.

19. The field-effect transistor of claim 14 in which the active layer comprises PT—$COONH_4$ having a field-effect mobility within the range of about 0 to 0.72 $cm^2$/Vs for n-type field effects and from 0 to 1.73 $cm^2$/Vs for p-type field effects.

* * * * *